(12) United States Patent
Javorka et al.

(10) Patent No.: US 9,401,423 B2
(45) Date of Patent: Jul. 26, 2016

(54) ENHANCING TRANSISTOR PERFORMANCE AND RELIABILITY BY INCORPORATING DEUTERIUM INTO A STRAINED CAPPING LAYER

(71) Applicant: GLOBALFOUNDRIES Inc., Grand Cayman (KY)

(72) Inventors: Peter Javorka, Radeburg (DE); Stefan Flachowsky, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/943,521

(22) Filed: Jul. 16, 2013

(65) Prior Publication Data
US 2015/0021693 A1    Jan. 22, 2015

(51) Int. Cl.
| | |
|---|---|
| *H01L 21/02* | (2006.01) |
| *H01L 29/78* | (2006.01) |
| *H01L 21/28* | (2006.01) |
| *H01L 21/30* | (2006.01) |
| *H01L 21/3115* | (2006.01) |
| *H01L 21/8238* | (2006.01) |

(52) U.S. Cl.
CPC ........ *H01L 29/7843* (2013.01); *H01L 21/0217* (2013.01); *H01L 21/02211* (2013.01); *H01L 21/02274* (2013.01); *H01L 21/28176* (2013.01); *H01L 21/3003* (2013.01); *H01L 21/3115* (2013.01); *H01L 21/823807* (2013.01); *H01L 21/823857* (2013.01); *H01L 21/823864* (2013.01)

(58) Field of Classification Search
CPC ............ H01L 21/3003; H01L 21/0217; H01L 21/02274; H01L 21/823857; H01L 21/823807; H01L 21/823864; H01L 21/28176; H01L 21/3115

USPC .......... 438/285, 761, 305, 637, 151; 257/369, 257/190, 410
See application file for complete search history.

(56) References Cited

U.S. PATENT DOCUMENTS

| | | | | |
|---|---|---|---|---|
| 2005/0009210 | A1* | 1/2005 | Hosotani | B82Y 10/00 438/3 |
| 2005/0064729 | A1* | 3/2005 | Rueger | C23C 16/045 438/788 |

(Continued)

OTHER PUBLICATIONS

Ng et al., "Effect of the Nitrous Oxide Plasma Treatment on the MIM Capacitor,"; IEEE vol. 23, No. 9, Sep. 2002, pp. 529-531.*

(Continued)

*Primary Examiner* — Kenneth Parker
*Assistant Examiner* — Bo Fan
(74) *Attorney, Agent, or Firm* — Amerson Law Firm, PLLC

(57) ABSTRACT

When forming transistors with deuterium enhanced gate dielectrics and strained channel regions, the manufacturing processes of strain-inducing dielectric material layers formed above the transistors may be employed to efficiently introduce and diffuse the deuterium to the gate dielectrics. The incorporation of deuterium into the strain-inducing dielectric material layers may be accomplished on the basis of a deposition process in which deuterium is present in the process environment during deposition. The process temperature of the deposition process may be chosen to perform—potentially in combination with further subsequently performed process steps—a sufficient diffusion of deuterium to the gate dielectrics.

23 Claims, 12 Drawing Sheets

(56) References Cited

U.S. PATENT DOCUMENTS

| | | | |
|---|---|---|---|
| 2005/0255684 A1* | 11/2005 | Koldiaev et al. | 438/528 |
| 2010/0041242 A1* | 2/2010 | Lim et al. | 438/761 |
| 2011/0260256 A1* | 10/2011 | Koide | 257/368 |

OTHER PUBLICATIONS

Choi et al., Effects of Deuterium Anneal on MOSFETs with HfO2 Gate Dielectrics, IEEE Electron Device Letters, 24:144-146, Mar. 2003.

* cited by examiner

ENHANCING TRANSISTOR PERFORMANCE AND RELIABILITY BY INCORPORATING DEUTERIUM INTO A STRAINED CAPPING LAYER

BACKGROUND OF THE INVENTION

1. Field of the Invention

Generally, the present disclosure relates to the field of integrated circuits, and, more particularly, to the manufacture of field effect transistors having a strained channel region caused by a stressed dielectric material formed above the transistor.

2. Description of the Related Art

Integrated circuits typically comprise a large number of circuit elements on a given chip area according to a specified circuit layout, wherein, in complex circuits, the field effect transistor represents one important device component. Generally, a plurality of process technologies are currently practiced, wherein, for complex circuitry based on field effect transistors, such as microprocessors, storage chips and the like, MOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, the conductivity of the channel region represents an important factor that substantially affects the performance of the MOS transistors. Thus, the reduction of the channel length, and associated therewith the reduction of the channel resistivity, may be dominant design criteria for accomplishing an increase in the operating speed of integrated circuits.

The shrinkage of the transistor dimensions, however, involves a plurality of issues associated therewith that have to be addressed so as to not unduly offset the advantages obtained by steadily decreasing the channel length of MOS transistors. One problem in this respect is the reduction of the thickness of the gate dielectric layer in order to maintain the desired channel controllability on the basis of increased capacitive coupling. With the thickness of silicon oxide based gate dielectrics approaching 1.5 nanometers and less, the further scaling of the channel length may be difficult due to an unacceptable increase of leakage currents through the gate dielectric. Thus, high-k oxides having a relative dielectric constant of 10 and more, such as, e.g., hafnium oxide, are employed as gate dielectrics, preferably in combination with a thin silicon oxide liner to maintain an appropriate channel/dielectric interface characteristic. Although high-k gate dielectrics allow for a further down-scaling of MOS transistors, there is still a further demand for enhancing performance of the MOS transistors. Furthermore, in view of the problems associated with high-k gate dielectrics, e.g., an insufficient threshold voltage stability, silicon oxide based gate dielectrics are also utilized in state of the art MOS transistors. For this reason, it has been proposed to enhance device performance of the transistor elements not only by reducing the transistor dimensions but also by increasing the charge carrier mobility in the channel region. One efficient approach in this respect is the modification of the lattice structure in the channel region, for instance by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase in the conductivity for N-type transistors. On the other hand, compressive strain in the channel region may increase the mobility of holes, thereby providing the potential for enhancing the performance of P-type transistors. Consequently, it has been proposed to introduce, for instance, a silicon/germanium layer or a silicon/carbon layer near the channel region so as to create compressive or tensile stress. In this manner, transistor performance may be considerably enhanced by the introduction of strain-creating materials in the drain and source areas, in particular for P-channel transistors, as, for instance, a silicon/germanium alloy embedded in the drain and source areas has proven to be a very efficient strain-inducing source. To this end, additional epitaxial growth techniques have to be developed and implemented into the process flow so as to form the germanium-containing material.

In other approaches, additionally or alternatively to the above-described concept, a technique is frequently used that enables the creation of desired stress conditions within the channel region of different transistor elements by modifying the stress characteristics of a material that is closely positioned to the transistor structure in order to allow an efficient stress transfer to the channel region. For example, the spacer typically provided at sidewalls of the gate electrodes and the contact etch stop layer that is formed above the basic transistor structure are promising candidates for creating external stress which may then be transferred into the transistor. The contact etch stop layer is, therefore, frequently used since it may be required anyway for controlling an etch process designed to form contact openings to the gate, drain and source terminals in an interlayer dielectric material. The effective control of mechanical stress in the channel region, i.e., an effective stress engineering, may be accomplished for different types of transistors by individually adjusting the internal stress in the contact etch stop layers located above the respective transistor elements so as to position a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 3 Giga Pascal (GPa) or significantly higher of compressive stress, while stress levels of 1 GPa and higher may be obtained for tensile-stressed silicon nitride materials. The type and the magnitude of the intrinsic stress may be efficiently adjusted by selecting appropriate deposition parameters and selecting appropriate post-deposition treatments based on UV (ultraviolet) treatments, wherein generally process temperatures during deposition and post-deposition treatments are adjusted to 500° C. or less so as to not unduly affect other materials, such as a metal silicide, e.g., a nickel silicide, that is typically formed in the drain and source regions prior to forming the stressed silicon nitride material.

As the contact etch stop layer is positioned close to the transistor, the intrinsic stress may be efficiently transferred into the channel region, thereby significantly improving the performance thereof. Moreover, for advanced applications, the strain-inducing contact etch stop layer may be efficiently combined with other strain-inducing mechanisms, such as strained or relaxed semiconductor materials that are incorporated at appropriate transistor areas in order to also create a desired strain in the channel region. Consequently, the stressed contact etch stop layer is a well-established design feature for advanced semiconductor devices.

An interlayer dielectric, which typically comprises silicon dioxide, is formed on the contact etch stop layer. The interlayer dielectric is planarized to provide a basis for contact elements formed in an opening etched into the interlayer dielectric to provide an electrical connection to the transistor elements, wherein the etch process is stopped in the contact etch stop layer. After removal of the exposed contact etch stop layer regions and exposing contact regions of the transistor elements, the contact elements are formed by depositing an appropriate contact material, such as, for example, tungsten, in the contact opening. In view of the mentioned insufficient threshold voltage stability of high-k MOS transistors and hot carrier degradation of silicon oxide based transistors observed in advanced semiconductor devices, a deuterium ($D_2$) anneal may be performed prior to forming the contact elements to improve the reliability characteristics of MOS transistors. In the annealing process, that may last up to several hours, incorporated deuterium may diffuse to the gate dielectric/channel interface of the transistor. The deuterium is expected to improve the interface quality of the transistor.

As CMOS devices comprise complementary N-channel and P-channel transistors, CMOS devices may comprise transistors with tensile and compressively strained contact etch stop layers which may be formed by a so-called dual stress liner approach.

With reference to FIGS. 1a-1g, a typical integration scheme will now be described in more detail in which a dual stress liner approach and a deuterium anneal is applied.

FIG. 1a schematically illustrates a cross-sectional view of a semiconductor device 100 comprising a substrate 101, above which is provided a semiconductor layer 102, such as a silicon-based semiconductor material whose electronic characteristics are to be enhanced by locally introducing a desired type of strain, as discussed above. The semiconductor layer 102 is laterally divided into a plurality of active regions, which are to be understood as semiconductor regions of the layer 102, in and above which corresponding transistors are to be formed. In the example shown, the first active region 102a is laterally separated from a second active region 102b by an isolation region 102c, which may be provided in the form of a shallow trench isolation. In the example shown, the active region 102a corresponds to an N-channel transistor 150a, while the active region 102b has formed therein and thereon a P-channel transistor 150b. The transistors 150a, 150b comprise gate electrode structures 160, which may have basically the same configuration and which may comprise a gate dielectric material 161, which may comprise silicon oxide and/or a high-k material, and an electrode material 162, which typically includes a semiconductor material such as silicon and/or a metal or metal compound. Usually the overall conductivity of the gate electrode structures 160 is increased by providing a metal silicide 163 on and within the semiconductor material 162. Furthermore, a spacer structure 164 is provided on sidewalls, which may be used for appropriately defining the lateral and vertical profile of drain and source regions 152 and the lateral offset of metal silicide regions 153. Consequently, in a further advanced manufacturing stage, an appropriate strain-inducing mechanism is to be implemented so as to create a desired type of strain, i.e., a tensile strain, in a channel region 151 of the transistor 150a. Similarly, an appropriate strain-inducing mechanism is to be implemented for the transistor 150b so as to induce a compressive strain in the active region 102b. In some advanced approaches, the transistor 150b may comprise an additional strain-inducing mechanism in the form of an embedded silicon/germanium material 154, which is provided in a strained state, thereby also inducing a high compressive strain in the channel region 151 of the transistor 150b. Furthermore, in this manufacturing stage, a thin etch stop layer 111, for instance in the form of a silicon dioxide material, may be formed above the transistors 150a, 150b in order to reduce degradation of sensitive materials of the transistors 150a, 150b upon depositing a highly stressed dielectric material and patterning the same, as will be described later on in more detail. In other strategies (not shown), the etch stop layer 111 may be omitted in order to enhance the overall stress transfer efficiency of a stressed dielectric material still to be formed.

The semiconductor device 100 as illustrated in FIG. 1a may be formed on the basis of the following processes. The active regions 102a, 102b may be formed by appropriately patterning the semiconductor layer 102 and forming the isolation region 102c, followed by the incorporation of appropriate dopant species for adjusting the basic transistor characteristics of the P-channel transistor 150b and the N-channel transistor 150a. To this end, well-established implantation techniques and masking steps are applied. Thereafter, the gate electrode structures 160 are formed, for instance, by depositing appropriate materials for the layers 161 and 162 and subsequently patterning these materials, possibly by providing appropriate hard mask materials and the like, depending on the overall configuration of the gate electrode structures 160 and the patterning strategy to be applied. In sophisticated applications, a length of the gate electrode structures 160, i.e., in FIG. 1a, the horizontal extension of the electrode material 162, is approximately 50 nm and less. Next, drain and source dopant species may be incorporated into the active regions 102a, 102b while forming the spacer structure 164, which may act as an appropriate implantation mask in order to obtain a desired lateral and vertical profile for the regions 152. In some cases when the strain-inducing semiconductor material 154 is to be incorporated into the active region 102b, an appropriate process sequence is supplied after patterning the gate electrode structures 160 and prior to forming the spacer structure 164. To this end, cavities may be etched into the active region 102b while covering the active region 102a and subsequently the material 154 may be grown in the cavities on the basis of selective epitaxial growth techniques. Thereafter, the drain and source regions 152 and the spacer structure 164 may be formed as required. After any high temperature processes, typically the metal silicide materials 153, 163 are formed by applying well-established silicidation techniques wherein a refractory metal is deposited and treated so as to be converted into a metal silicide. For example, frequently nickel, possibly in combination with a certain amount of platinum, is used as the refractory metal, thereby obtaining a highly conductive metal silicide. Next, if required, the etch stop layer 111 may be deposited by any well-established deposition technique.

FIG. 1b schematically illustrates the semiconductor device 100 in a further advanced manufacturing stage. As shown, a strain-inducing dielectric layer 112a, for instance provided in the form of a silicon nitride material, is formed above the transistors 150a, 150b and thus induces a tensile strain component in the active regions 102a, 102b. Furthermore, in the example shown, an additional etch control layer 113, for instance provided in the form of a silicon dioxide material, is formed on the strain-inducing layer 112a, which may be used in a later manufacturing stage upon patterning a further strain-inducing dielectric material still to be formed. Moreover, since the type of internal stress of the layer 112a is inappropriate for the transistor 150b, a resist mask 114 is typically provided so as to enable the removal of an unwanted portion of the layer 112a in a subsequent etch sequence.

The layer 112a may be formed on the basis of well-established plasma enhanced CVD techniques in which, as discussed above, process parameters such as ion bombardment, pressure, composition of precursor gases and the like are appropriately selected so as to deposit the material with a high internal stress level. Furthermore, after deposition of the base material of the layer 112a, further treatment may be performed, for instance by using UV radiation and the like, thereby even further enhancing or generally adjusting the desired magnitude of the internal stress level in the layer 112a. In this manner, a tensile stress level of up to 1.8 GPa or even higher may be achieved while process temperatures may be maintained at or below 500° C., thereby avoiding significant modifications of sensitive materials, such as the nickel silicide 153, 163 and the like. If required, the layer 113 may be deposited, for instance prior to or after any additional treatment of the material 112a, by applying any appropriate deposition technique and the like. Finally, a lithography process may be applied in order to form the resist mask 114 by using well-established strategies.

FIG. 1c schematically illustrates the device 100 in a process environment 120, which is appropriately configured so as to perform a plasma-based etch process 121. Typically, the environment 120 may be provided in the form of an etch chamber in which an appropriate plasma may be established. The plasma is typically established on the basis of oxygen, gas and a CHF gas, which thus provides appropriate radicals in order to efficiently remove material of the layer 112a, while a certain degree of selectivity to silicon dioxide may be achieved, thereby enabling a certain control of the etch process 121. During the process 121, typically a certain amount of the material of the resist mask 114 is also consumed. Subsequently, a further plasma assisted process on the basis of a substantially pure oxygen atmosphere is performed in the same process environment 120 in order to remove the resist mask 114 and other etch byproducts that may have deposited on the surface of the device 100 during the preceding plasma-based etch process.

Typically, after removal from the process environment 120, the further processing is continued by performing a further cleaning process, possibly removing the residues of the etch stop layer 111 from above the transistor 150b, if this layer 111 is provided at all. To this end, wet chemical cleaning recipes may be applied.

FIG. 1d schematically illustrates the device 100 in a further advanced manufacturing stage. As shown, a further strain-inducing dielectric layer 112b is formed above the transistors 150a, 150b in order to introduce a desired strain in the transistor 150b, for instance in the form of a compressive strain, as discussed above. To this end, the layer 112b may be deposited on the basis of plasma enhanced CVD techniques, possibly in combination with additional radiation treatments and the like, so as to obtain a moderately high internal stress level in the material of the layer 112b. For example, a compressive stress level of 3.5 GPa and even higher may be accomplished on the basis of presently available deposition and treatment recipes for silicon nitride material. Moreover, in order to avoid undue effect of a compressive stress level in the layer 112b on the transistor 150a, i.e., on the previously provided tensile stressed dielectric layer 112a, in a dual stress liner approach, the layer 112b may be removed from above the transistor 150a, which is accomplished by providing a further resist mask 115 and performing a further etch sequence on the basis of similar process parameters as described above with reference to the plasma assisted process 121 (FIG. 1c).

FIG. 1e schematically illustrates the device 100 within the process environment 120 in a phase when the layer 112b is already removed from above the transistor 150a and the remaining portion of the resist mask 115 is removed, which may be accomplished on the basis of an oxygen plasma 121b, as described above. Next, a further cleaning process is applied in which, if required, the layer 113 may also be removed, thereby preparing the surface of the device 100 for the deposition of an interlayer dielectric material.

FIG. 1f schematically illustrates the device 100 in a further advanced manufacturing stage. An interlayer dielectric layer 180 is formed above the layers 112a, 112b. Any well-established deposition recipes may be applied in order to form an interlayer dielectric material, such as a silicon dioxide material, having a desired thickness in accordance with the overall device requirements. The interlayer dielectric layer 180 may by planarized, e.g., by well-established chemical mechanical polishing techniques. A deuterium ($D_2$) anneal 175 may be performed after deposition of the interlayer dielectric layer 180 as described above to improve the reliability characteristics of the N-channel and P-channel transistors 150a, 150b. A high pressure deuterium ($D_2$) anneal at a temperature in the range of approximately 600-700° C. may be performed for up to several hours to incorporate deuterium and diffuse deuterium close to the gate dielectric/channel interface of the N-channel and P-channel transistors 150a, 150b.

Thereafter, the interlayer dielectric material is patterned so as to form openings (not shown) therein, wherein the layers 112a, 112b act as efficient etch stop materials. Thereafter, the etch stop layers 112a, 112b are appropriately etched so as to increase a depth of the corresponding contact openings so as to connect to the contact materials 153 and 163, respectively. Thereafter, the contact openings are filled with high conductive material, thereby accomplishing the contact level of the device 100.

Basically, the above-described dual stress liner approach is a very efficient mechanism for inducing a desired type of strain for N-channel transistors and P-channel transistors. In actual integration schemes for providing a deuterium anneal and selectively providing a tensile-stressed dielectric material and a compressively-stressed dielectric material above respective transistor elements, however, the finally observed performance and reliability of these transistors may be significantly less compared to the expected characteristics.

In view of the situation described above, the present disclosure relates to manufacturing techniques in which deuterium is incorporated in a transistor comprising a strain-inducing capping layer so as to obtain superior overall transistor performance and reliability compared to conventional techniques.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for incorporating deuterium efficiently on the basis of a dielectric material layer formed above a transistor structure, wherein transistor performance and reliability may be enhanced more efficiently compared to conventional strategies for incorporating deuterium since it has been recognized that even thin dielectric layers, such as strained contact etch stop layers, may have a significant influence on the finally obtained transistor performance and reliability. Without intending to restrict the present application to the following explanation, it is assumed that contact etch stop layers exhibit a certain barrier behavior for deuterium diffusion in conventional deuterium annealing processes and may thus unduly reduce the amount of deuterium accumulated at the gate dielectric/channel material interface of the transistor.

The present disclosure provides transistors with deuterium enhanced gate dielectrics and strained channel regions, wherein the manufacturing processes of strain-inducing dielectric material layers formed above the transistors may be employed to efficiently introduce and diffuse the deuterium atoms to the gate dielectric layer of the transistors. The incorporation of deuterium into the strain-inducing dielectric material layers may be accomplished on the basis of a deposition process in which deuterium is present in the process environment during deposition. The process temperature of the deposition process may be chosen to perform—possibly in combination with further subsequently performed process steps—a sufficient diffusion of deuterium atoms to the gate dielectric layer.

One illustrative method disclosed herein includes providing a substrate including a field effect transistor. The method further includes forming a first dielectric layer above the field effect transistor, wherein deuterium is incorporated during formation of the first dielectric layer.

A further illustrative method disclosed herein includes forming a first strain-inducing dielectric layer above a first transistor and a second transistor. The method further includes selectively removing a portion of the first strain-inducing layer from above the second transistor. Additionally, the method includes forming a second strain-inducing dielectric layer above the first transistor and the second transistor, wherein at least one of the first and second strain-inducing dielectric layers is formed in the presence of deuterium in the process environment during formation. The method further includes selectively removing a portion of the second strain-inducing layer from above the first transistor.

One illustrative semiconductor device disclosed herein includes a field effect transistor and a first dielectric layer formed above the field effect transistor. The semiconductor device further includes a second dielectric layer formed above the first dielectric layer, wherein the first dielectric layer comprises deuterium and wherein a concentration of deuterium in the first dielectric layer is higher than a concentration of deuterium in the second dielectric layer.

A further illustrative semiconductor device disclosed herein includes a first and a second field effect transistor and a first strained dielectric layer formed above the first field effect transistor. The semiconductor device further includes a second strained dielectric layer formed above the second field effect transistor, wherein the first strained dielectric layer comprises deuterium and wherein a concentration of deuterium in the first strained dielectric layer is higher than a concentration of deuterium in the second strained dielectric layer.

BRIEF DESCRIPTION OF THE DRAWINGS

The disclosure may be understood by reference to the following description taken in conjunction with the accompanying drawings, in which like reference numerals identify like elements, and in which.

Figure 1A:
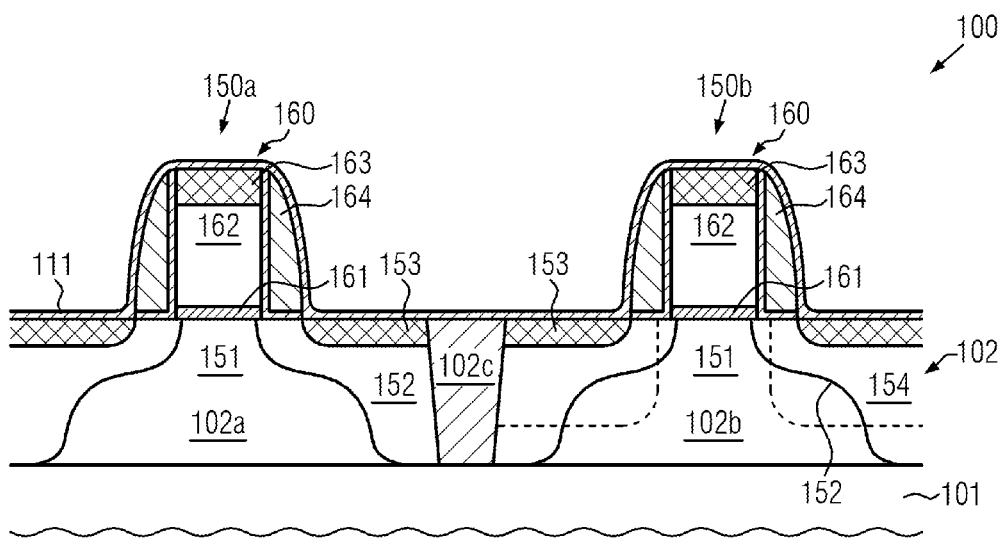
FIGS. 1a-1f schematically illustrate cross-sectional views of a semiconductor device during various manufacturing stages when applying a deuterium anneal and a dual stress liner approach according to conventional strategies.
Figure 1B:
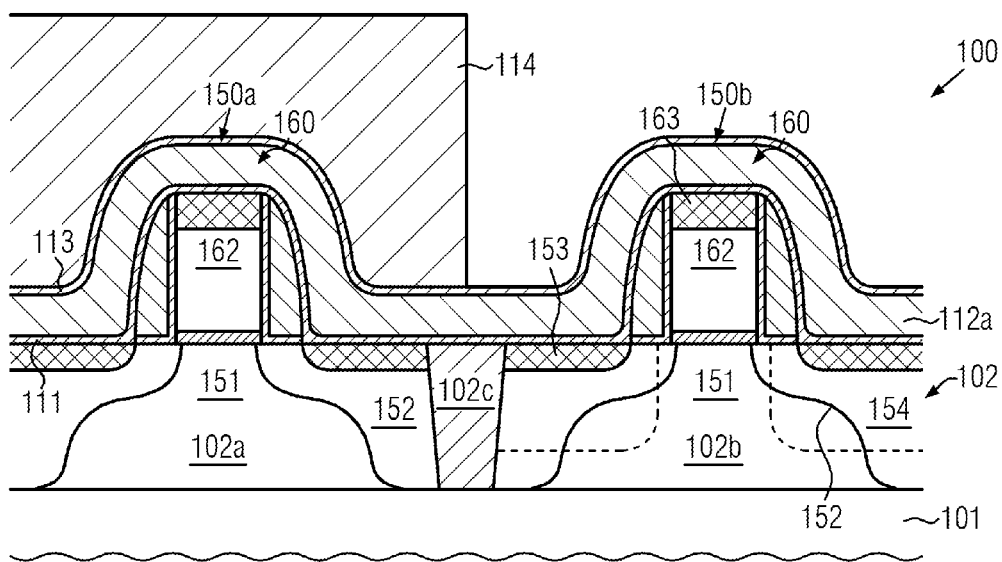
Figure 1C:
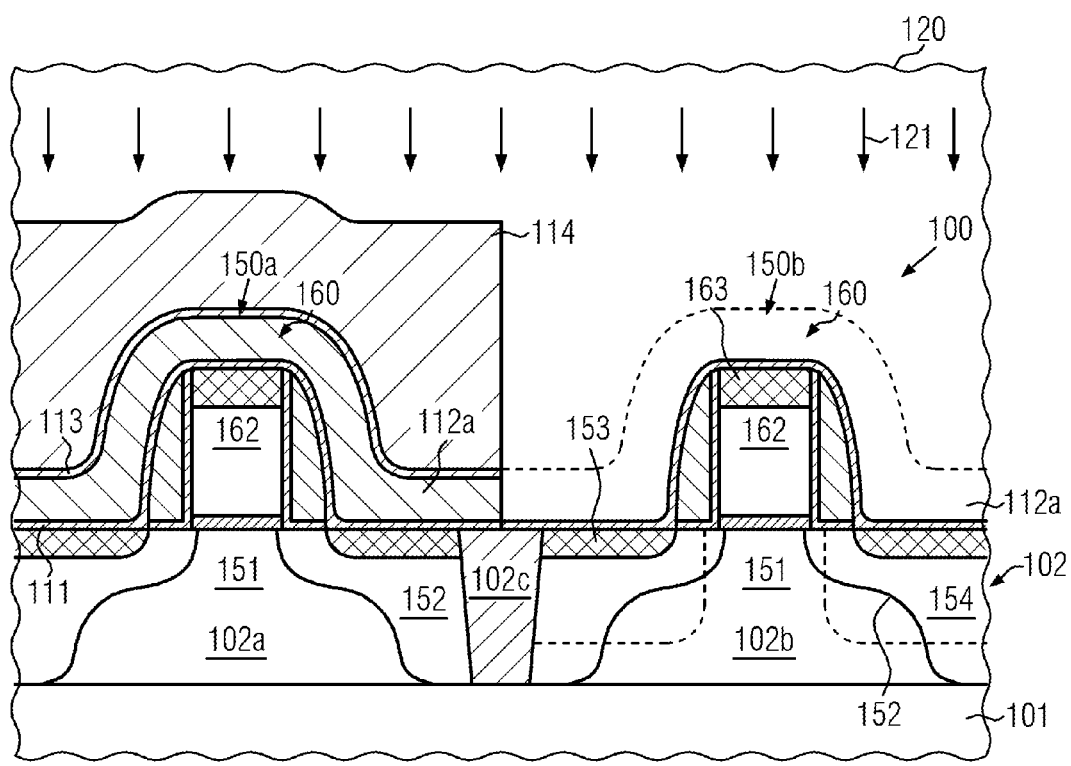
Figure 1D:
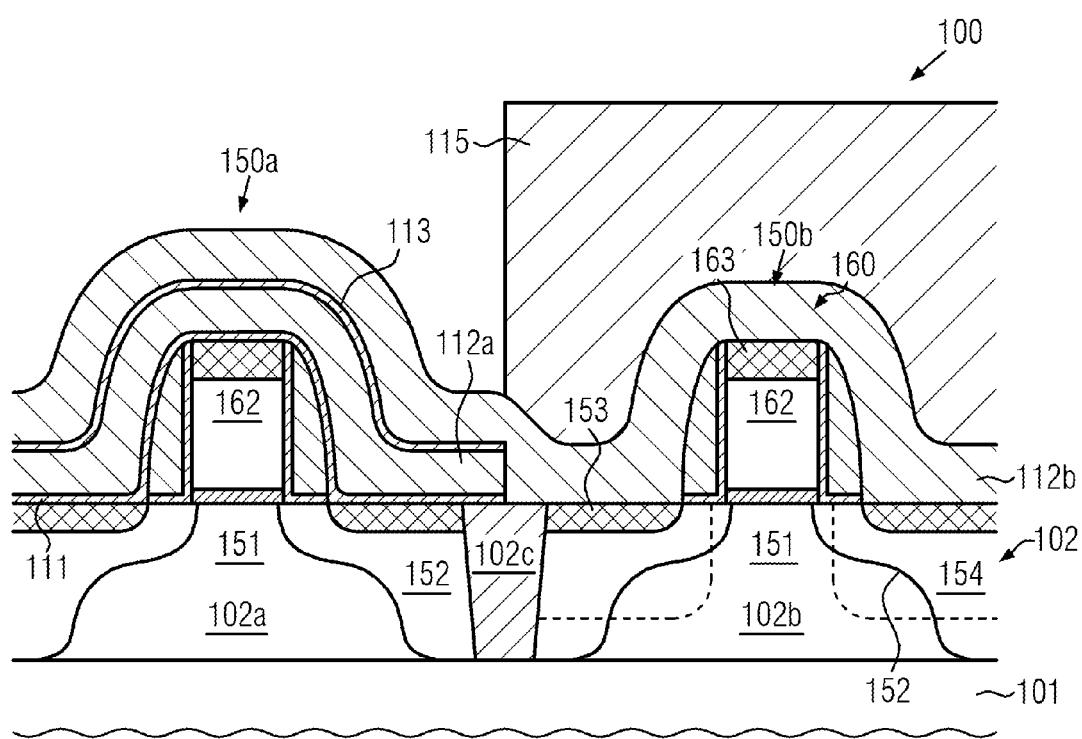
Figure 1E:
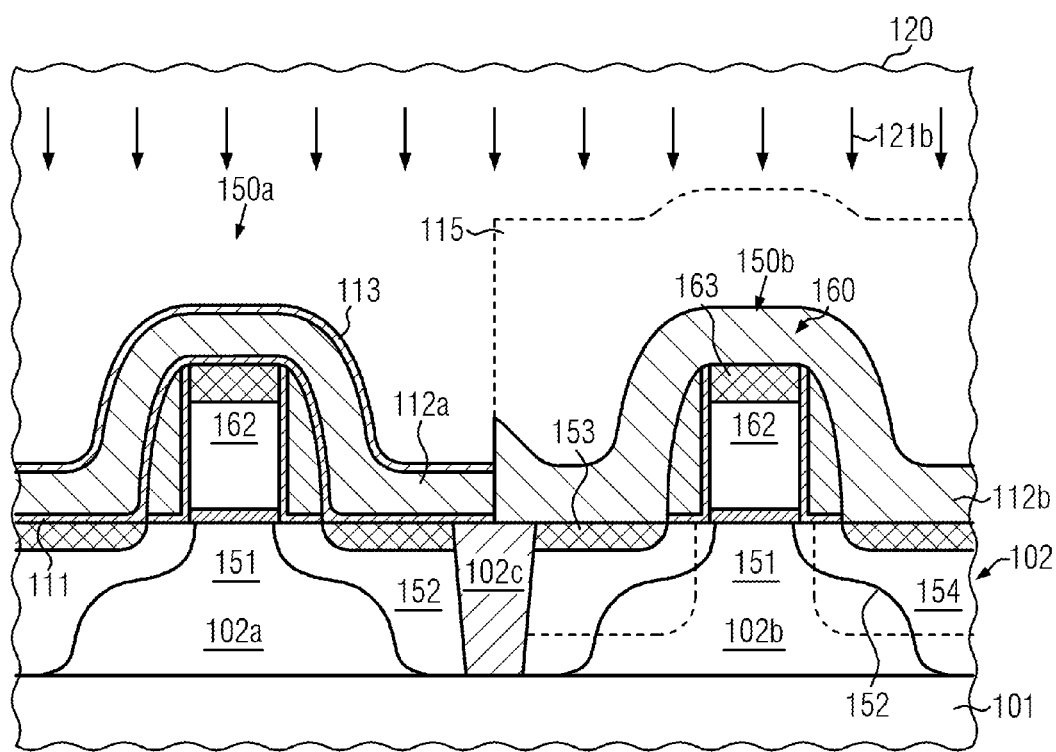
Figure 1F:
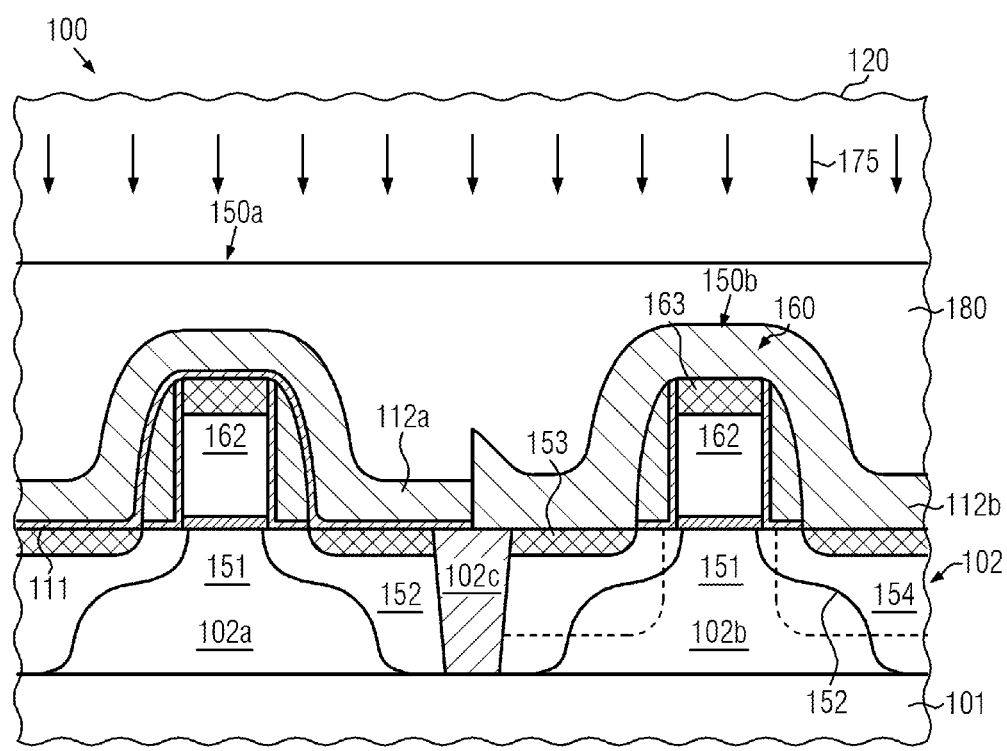

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, the present disclosure provides semiconductor devices comprising enhanced transistors comprising deuterium and techniques in which an efficient deuterium incorporating and diffusion mechanism on the basis of a deposition process of a dielectric material formed above a transistor structure is implemented, wherein a deuterium blocking effect of capping layers, such as, e.g., contact etch stop layers typically formed above transistors to facilitate source, drain and gate contact etch processes, is avoided or at least reduced. Furthermore, the deuterium atoms are incorporated closer to the gate dielectric layer so that diffusion of deuterium atoms to the gate dielectric layers requires only moderately-high temperatures and/or moderately-long lasting annealing periods. Thus, the amount of deuterium located finally at the gate dielectric/channel interface of the transistors may be increased so that the gate dielectric interface quality and/or the charge carrier mobility in the transistor channel may be improved so that performance and/or reliability of the formed transistors is improved compared to conventional manufacturing techniques. Furthermore, the additional conventional deuterium annealing process typically performed after interlayer dielectric deposition may be omitted so that the total process time and consequently the total manufacturing costs may be reduced.

In illustrative embodiments, transistors with deuterium-enhanced gate dielectrics and strained channel regions are provided, wherein the manufacturing processes of strain-inducing dielectric material layers, such as strained contact etch stop layers formed above the transistors, may be employed to efficiently introduce and diffuse the deuterium atoms to the gate dielectric layers. The incorporation of deuterium into the strain-inducing dielectric material layers may be accomplished on the basis of a deposition process in which deuterium is present in the process environment during deposition. The process temperature of the deposition process may be chosen to perform—potentially in combination with further subsequently performed process steps—a sufficient diffusion of deuterium atoms to the gate dielectric layer. The disclosed technique is also applicable to non-strained contact etch stop layers as long as sufficient deuterium is incorporated into the contact etch stop layer material and diffused to the gate dielectric layer. To this end, deuterium ($D_2$) is included in the process environment during deposition of the strain-inducing dielectric material layer above the transistor so that a certain amount of deuterium is incorporated, possibly in combination with hydrogen that may be provided by other precursor gases typically employed in the deposition process to provide the desired species of the dielectric layers.

In illustrative embodiments, the contact etch stop layer may comprise silicon, nitrogen and hydrogen/deuterium, wherein the hydrogen/deuterium concentration substantially defines the stress level. In a strained silicon/nitride layer, a low hydrogen/deuterium concentration is associated with an intrinsic tensile strain, whereas a high hydrogen/deuterium concentration leads to an intrinsic compressive strain. Silicon nitride deposition is typically performed by a chemical vapor deposition process, wherein a certain process temperature is required to provide a desired chemical reaction rate and hence a desired deposition rate. Thus, a deuterium diffusion process is already initiated during the deposition process. Furthermore, radiation treatments, such as a UV cure process, may be performed after the deposition process, in particular to reduce the hydrogen/deuterium concentration of tensile strained silicon nitride contact etch stop layers and to increase the tensile strain level. Such a UV cure process may further support the deuterium diffusion so that at least a certain amount of deuterium removed from the silicon nitride layer during the UV cure step may be diffused to the gate dielectric of the transistor. Thus, the influence of the removed hydrogen or deuterium percentage on the intrinsic layer stress is further investigated.

Figure 2:
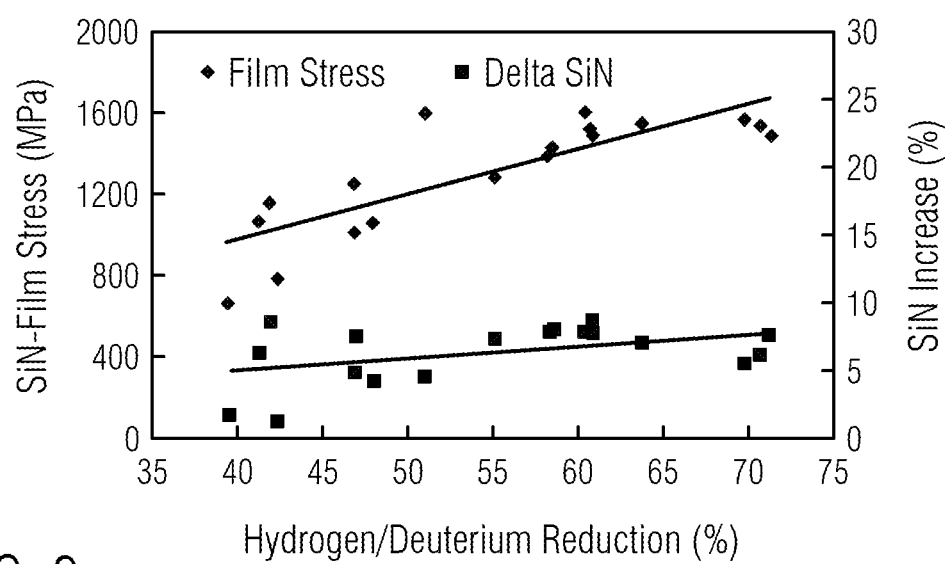
FIG. 2 illustrates measurement results indicating the influence of a hydrogen/deuterium reduction on the strain characteristic of a silicon nitride layer.

FIG. 2 depicts measurement results indicating the dependence of an intrinsic silicon nitride film stress and of a silicon nitride increase percentage from a hydrogen/deuterium reduction percentage achieved, e.g., by a UV cure process. For example, a hydrogen/deuterium reduction of 50% of the incorporated atoms increases the silicon nitride content of the layer material by approximately 6%, i.e., the dangling bonds of silicon and nitrogen atoms generated due to the reduction of hydrogen/deuterium concentration in the strained silicon nitride material form new silicon nitride bonds, increasing the silicon nitride content of the strained material and, thus, the intrinsic tensile strain of the material is increased. UV modified nitride films finally consist substantially of a stoichiometric $Si_3N_4$ network which, however, still may comprise defects or vacancies due to localized groups of Si—H and N—H bonds. In the depicted example, a removal of 50% of the hydrogen/deuterium contained initially in the deposited material results in an intrinsic tensile strain of approximately 1.2 GPa, whereas a further reduction of the hydrogen/deuterium content, so that about 70% of the initial hydrogen/deuterium atoms are removed, increases the tensile strain to approximately 1.6 GPa. Thus, a corresponding UV cure process provides an efficient mechanism to increase the tensile strain of deuterium-comprising silicon nitride material, whereas concurrently the diffusion process of deuterium to the gate dielectric layer is supported.

With reference to FIGS. 3a-3b and 4a-4d, further illustrative embodiments will now be described in more detail, wherein reference is also made to FIGS. 1a-1f, if appropriate, for instance in order to not unduly repeat the description of components and process sequences which may also be efficiently used in the illustrative embodiments.

Figure 3A:
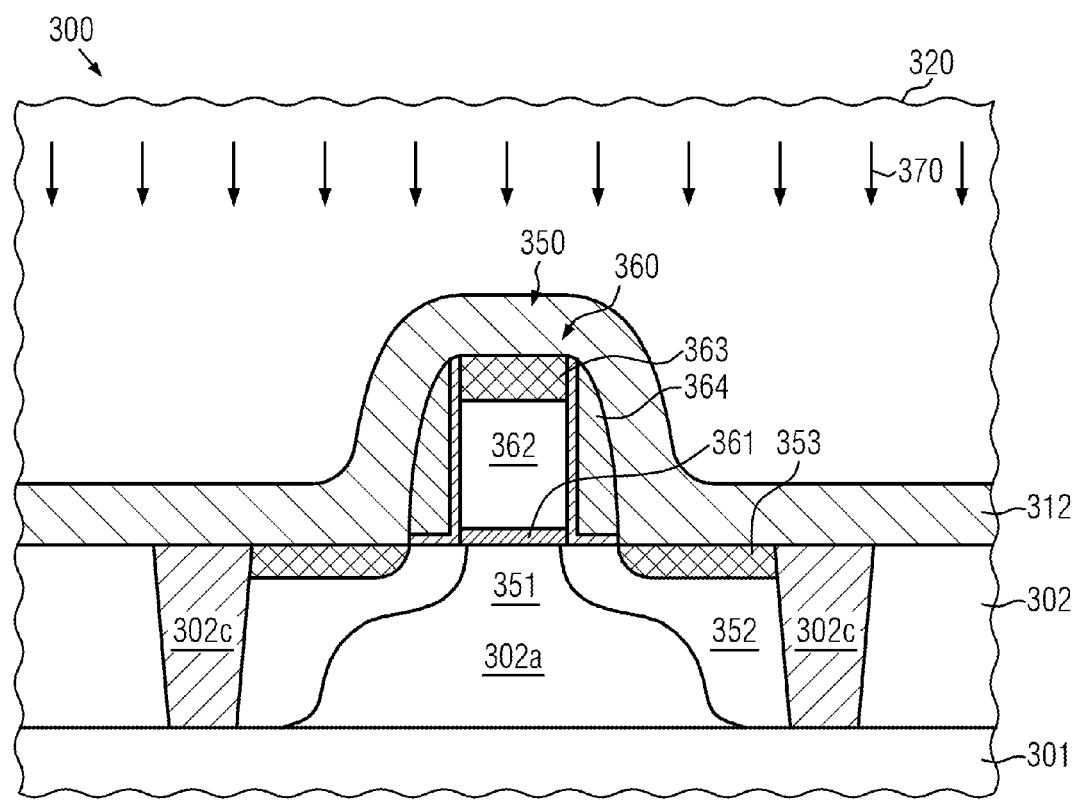
FIGS. 3a-3b schematically illustrate cross-sectional views of a semiconductor device during various manufacturing stages in which deuterium is incorporated during deposition of a capping layer according to illustrative embodiments of the present disclosure.

FIG. 3a schematically illustrates a cross-sectional view of a semiconductor device 300 comprising a substrate 301 in combination with a semiconductor layer 302 in which an active region 302a is formed. As discussed above, the active region may be delineated by appropriately forming an isolation region 302c. A transistor 350 is formed in and above the active region 302a and may represent an N-channel transistor or a P-channel transistor. The transistor 350 may have basically the same configuration as the transistors previously described with respect to the semiconductor device 100, i.e., the transistor may comprise a gate electrode structure 360 including a gate dielectric material 361, an electrode material 362 and a metal silicide 363. The gate dielectric material 361 may comprise a high-k material such as, e.g., hafnium oxide, and/or a silicon oxide based material such as, e.g., silicon oxide or silicon oxynitride. High-k materials are considered as dielectric materials having a permittivity of 10 or more. Furthermore, an appropriate spacer structure 364 may be provided so as to define appropriate sidewalls of the gate electrode structure 360. Similarly, drain and source regions 352 may be provided in the active region 302a and metal silicide regions 353 may be formed therein. Furthermore, an optional strain-inducing semiconductor material (not shown), such as a silicon/germanium material, in case the transistor 350 represents a P-channel transistor, may be formed in the active region 302a in order to induce a desired compressive strain in the channel region 351.

With respect to a process strategy for forming the transistor 350, the same criteria may apply as previously explained with reference to the semiconductor device 100. Moreover, in this manufacturing stage, a strain-inducing dielectric material layer 312, such as a silicon nitride layer having, for instance, an intrinsic tensile stress, may be formed above the transistor 350 by a chemical vapor deposition (CVD) process 370, wherein, during the deposition process, deuterium in combination with other precursor gases is present in the process environment to achieve a deuterium incorporation into the deposited material. Due to the moderately-high process temperature during the deposition process, concurrently a deuterium diffusion process resulting in a deuterium accumulation close to the gate dielectric/channel interface may take place. Even if plasma-enhanced CVD processes are used, which typically require lower process temperatures, a corresponding diffusion effect is achieved. If necessary, however, the process temperature may be slightly raised so that this diffusion effect may be increased. As the deposition process temperature may be limited by stability requirements of the previously-formed silicides 353 and 363 that may be nickel silicides, the silicide may need to be further stabilized, for example by incorporating additionally titanium into the silicide, which may allow for a moderately raised process temperature, without unduly adversely affecting the silicide with regard to mechanical stability and electrical conductivity.

In illustrative embodiments, the strain-inducing dielectric material layer 312 may comprise a silicon nitride material having an intrinsic tensile or compressive stress. Silicon nitride material may be deposited by a plasma-enhanced CVD process on the basis of the precursor gases silane ($SiH_4$) and ammonia ($NH_3$). In addition, a deuterium comprising precursor gas such as, e.g., $D_2$ gas, may be introduced into the process environment so as to concurrently incorporate deuterium into the deposited silicon nitride material. The silicon nitride material as deposited may further comprise hydrogen introduced by the precursor gases silane and ammonia. In an illustrative embodiment, the nitrogen source and the deuterium source may be provided by nitrogen diluted deuterium gas so that the ratio of deuterium to hydrogen incorporated in the silicon nitride material is increased so that the deuterium-enhancement effect may be increased. The process temperature during the deposition process may be in the range of approximately 450-650° C. Process temperatures above 550° C. may, in particular, be used in case the silicide materials 353 and 363 are thermally stabilized by platinum. As mentioned above, as compressively strained silicon nitride layers require a higher hydrogen/deuterium concentration to achieve a desired compressive intrinsic strain component, also the diffusion effect may be increased compared to a deposition process for a tensile strained silicon nitride material at a comparable process temperature. This aspect, however, may be compensated by the UV cure process that is typically performed after depositing tensile strained silicon nitride etch stop layers. In view of the fact that also non-strained silicon nitride material formed on the basis of silane and ammonia in the presence of deuterium may comprise a sufficient amount of deuterium/hydrogen, the formed contact etch stop layer may also comprise a non-strained silicon nitride material. In an illustrative embodiment, the dielectric material layer 312 may be formed directly on the transistor 350, resulting in an efficient deuterium diffusion mechanism.

After deposition of the dielectric material layer 312, the device 300 may be subjected to a further radiation treatment as described above. In particular, in case the dielectric layer 312 is intended to comprise a high tensile strain, the dielectric layer 312 may be subjected to a UV cure process, i.e., the dielectric layer 312 is subjected to ultra violet light radiation so that hydrogen/deuterium incorporated during the deposition process is at least partially removed from the dielectric layer as described above with reference to FIG. 2, wherein a portion of the removed deuterium atoms may diffuse to the gate dielectric/channel interface to further enhance the deuterium stabilization effect.

Figure 3B:
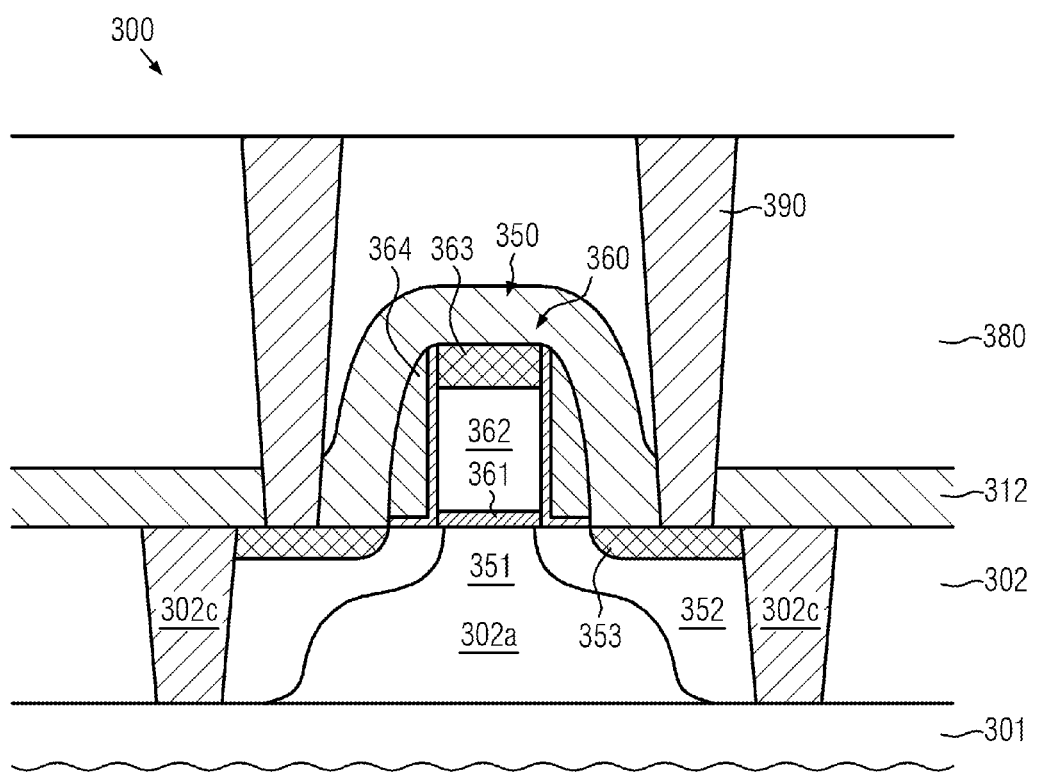

FIG. 3b schematically illustrates the semiconductor device 300 in a further advanced manufacturing stage in which an interlayer dielectric layer 380 is deposited above the dielectric layer 312 and contacts 390 are formed in the interlayer dielectric layer 380 to contact, e.g., the source/drain regions 353. The interlayer dielectric layer 380 may, for example, comprise a silicon dioxide based material that may be formed, for example, by well-established CVD processes, e.g., on the basis of silane or TEOS precursors. As the interlayer dielectric layer 380 is typically formed in the absence of deuterium, a concentration of deuterium in the dielectric layer 312 may be higher than a concentration of deuterium in the interlayer dielectric layer 380. The interlayer dielectric layer 380 may by planarized, e.g., by well-established chemical mechanical polishing techniques.

The contacts 390 may be formed by well-established patterning processes forming openings in the interlayer dielectric 380, wherein the dielectric layer 312, e.g., a silicon nitride layer, may be employed as an etch stop layer to facilitate controlling of the etch process. The contact opening may be filled by well-established deposition processes, e.g., a tungsten deposition process that might comprise a barrier deposition process to form a barrier layer (not shown) to avoid an interaction of components of the precursor gas with the interlayer dielectric material, if appropriate.

Consequently, upon processing the device 300, a sufficient amount of deuterium may be incorporated into the transistor 350 on the basis of a capping layer approach, wherein an additional deuterium annealing process may be omitted. Hence, reliability and performance of the transistor 350 may be enhanced due to an increased concentration of deuterium close to the gate dielectric/channel interface of the transistor 350. For example, a significant enhancement of device stability of transistor 350, e.g., with regard to threshold voltage stability, may be observed.

With reference to FIGS. 4a-4d and also referring to FIGS. 1a-1f and 3a-3b when necessary, further illustrative embodiments relating to a dual liner approach will now be described in more detail.

Figure 4A:
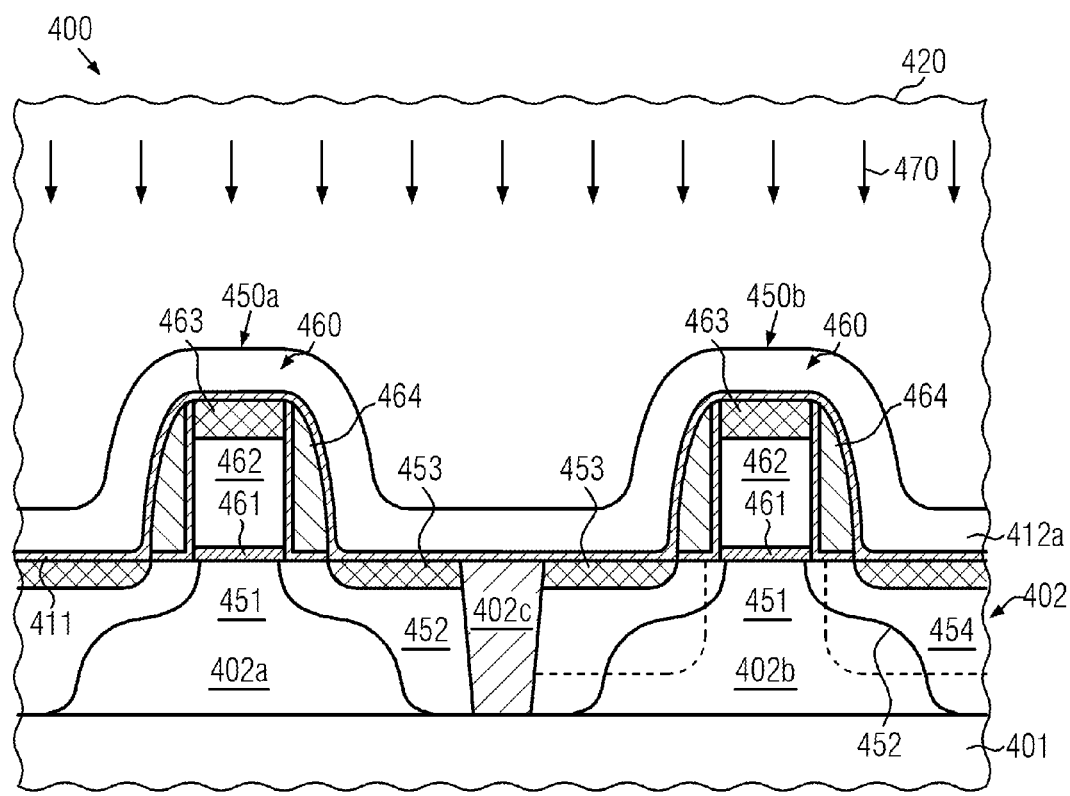
FIGS. 4a-4d schematically illustrate cross-sectional views of a semiconductor device during various manufacturing stages when applying a deuterium anneal and a dual stress liner approach according to illustrative embodiments of the present disclosure.

FIG. 4a schematically illustrates a cross-sectional view of a semiconductor device 400 comprising a substrate 401 in combination with a semiconductor layer 402 in which a plurality of active regions are formed, such as active regions 402a, 402b. As discussed above, the active regions may be divided by appropriately forming an isolation region 402c. A first transistor 450a is formed in and above the active region 402a and may, for instance, represent an N-channel transistor, while a second transistor 450b may be formed in and above the active region 402b and may represent a P-channel transistor. The transistors 450a, 450b may have basically the same configuration as the transistors previously described with respect to the semiconductor device 100, i.e., these transistors may comprise a gate electrode structure 460 including a gate dielectric material 461, a semiconductor electrode material 462 and a metal silicide 463. The gate dielectric material 461 may comprise a high-k material such as, e.g., hafnium oxide, and/or a silicon oxide based material such as, e.g., silicon oxide or silicon oxynitride. Furthermore, an appropriate spacer structure 464 may be provided so as to define appropriate sidewalls of the gate electrode structures 460. Similarly, drain and source regions 452 may be provided in the active regions 402a, 402b and metal silicide regions 453 may be formed therein. Furthermore, in the embodiment shown, an optional strain-inducing semiconductor material 454, such as a silicon/germanium material, may be formed in one or both of the active regions 402a, 402b. In the embodiment shown, the material 454 is selectively provided in the active region 402b in order to induce a desired strain in a channel region 451.

With respect to a process strategy for forming the transistors 450a, 450b, the same criteria may apply as previously explained with reference to the semiconductor device 100. Moreover, in this manufacturing stage, a strain-inducing dielectric material layer 412a, such as a silicon nitride material having, for instance, a tensile stress, may be formed above the transistors 450a, 450b by a deposition process 470 in the presence of deuterium in the process environment 420 similarly as described above with reference to semiconductor device 300.

As the strain-inducing dielectric material 412a is formed above the N-channel and above the P-channel transistors 450a, 450b, deuterium is diffused to the gate dielectric/channel interface during the deposition process of the dielectric material layer 412a of both transistors 450a, 450b to improve the gate dielectric interface quality to enhance the reliability of both transistors 450a, 450b. An optional etch stop layer 411 may be positioned below the material 412A as described with reference to semiconductor device 100 to facilitate a subsequently performed removal process for removing the strain-inducing dielectric material 412a from above the transistor 450b.

Figure 4B:
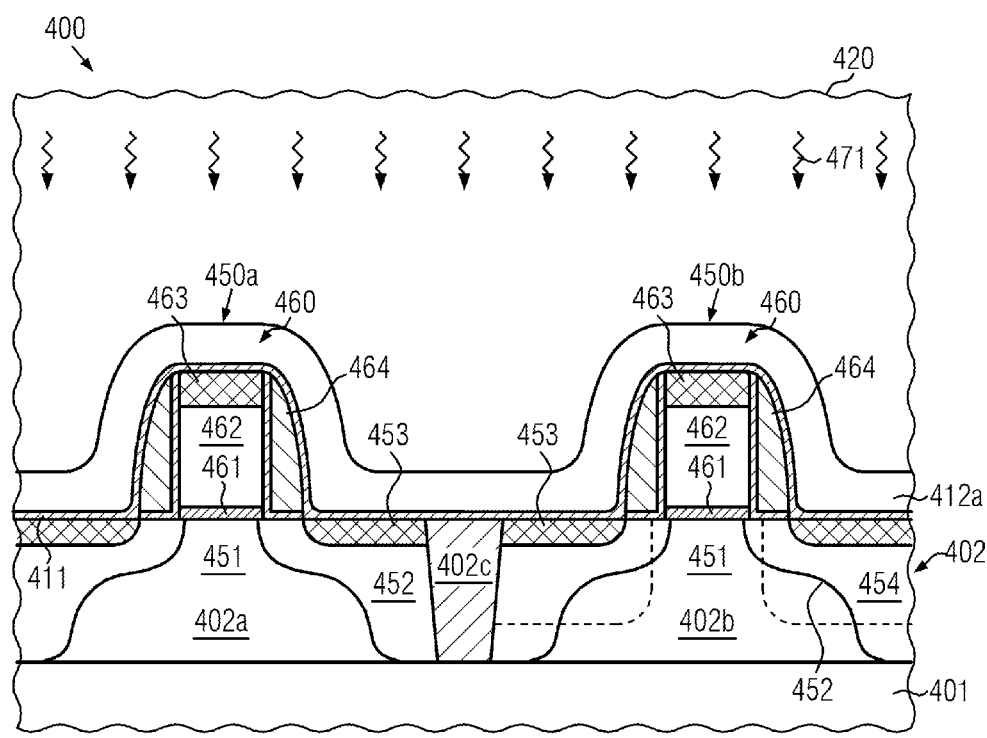

FIG. 4b schematically illustrates a cross-sectional view of the semiconductor device 400 in a further advanced optional manufacturing stage. After the deposition of the strained dielectric layer 412a, a radiation treatment 471, such as a UV cure process, as described with reference to the semiconductor device 300 and reference to FIG. 2, may be performed to improve the strain characteristics of the strained dielectric layer 412a and to diffuse further deuterium atoms to the gate dielectric/channel interface of the transistors 450a, 450b. In an illustrative embodiment, the UV-cure process 471 is performed in situ in the process chamber in which the deposition process has been performed. In other illustrative embodiments, the UV-cure process 471 may be performed in a different process chamber, if appropriate.

After the radiation treatment 471, the strained dielectric layer 412a may be removed from the transistor 450b. In the example shown, it is assumed that the internal stress level of the material 412a is inappropriate for the transistor 450b, and thus a resist mask (not shown) may be provided so as to expose the transistor 450b in order to enable the removal of the material 412a on the basis of an appropriate etch process, which is performed in a first process environment. It should be appreciated that the materials 411 and 412a as well as the resist mask may be formed on the basis of process strategies as are also discussed above with reference to the semiconductor device 100.

Figure 4C:
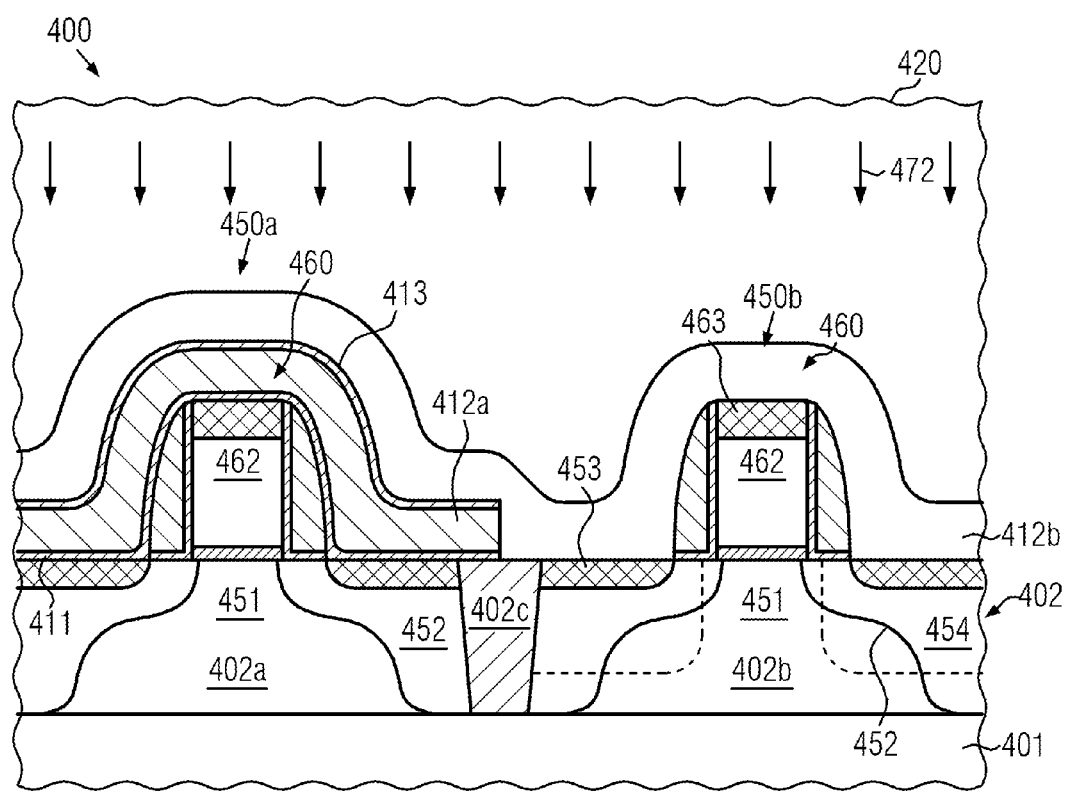

FIG. 4c schematically illustrates the semiconductor device 400 according to further illustrative embodiments in which a further strain-inducing material 412b may be formed above the transistors 450a, 450b according to a dual stress liner approach. The material 412b may be formed on the basis of process techniques as are also described above with reference to the device 100. As deuterium has been introduced into the transistor 450b in the previously-described deposition and possibly UV-cure processes, a conventional deposition process that does not include deuterium in the process environment during the deposition step may be performed. Consequently, the concentration of deuterium in the strain-inducing dielectric layer 412a is higher than a concentration of deuterium in the strain-inducing dielectric layer 412b.

In a further illustrative embodiment, however, the deposition process 472 may also be performed in the presence of deuterium so that the amount of deuterium atoms incorporated, in particular into transistor 450b, may be increased, if appropriate. If required, an etch control layer 413 may be formed on the material layer 412a prior to deposition of strain-inducing material 412b, as is also previously explained with reference to semiconductor device 100.

Figure 4D:
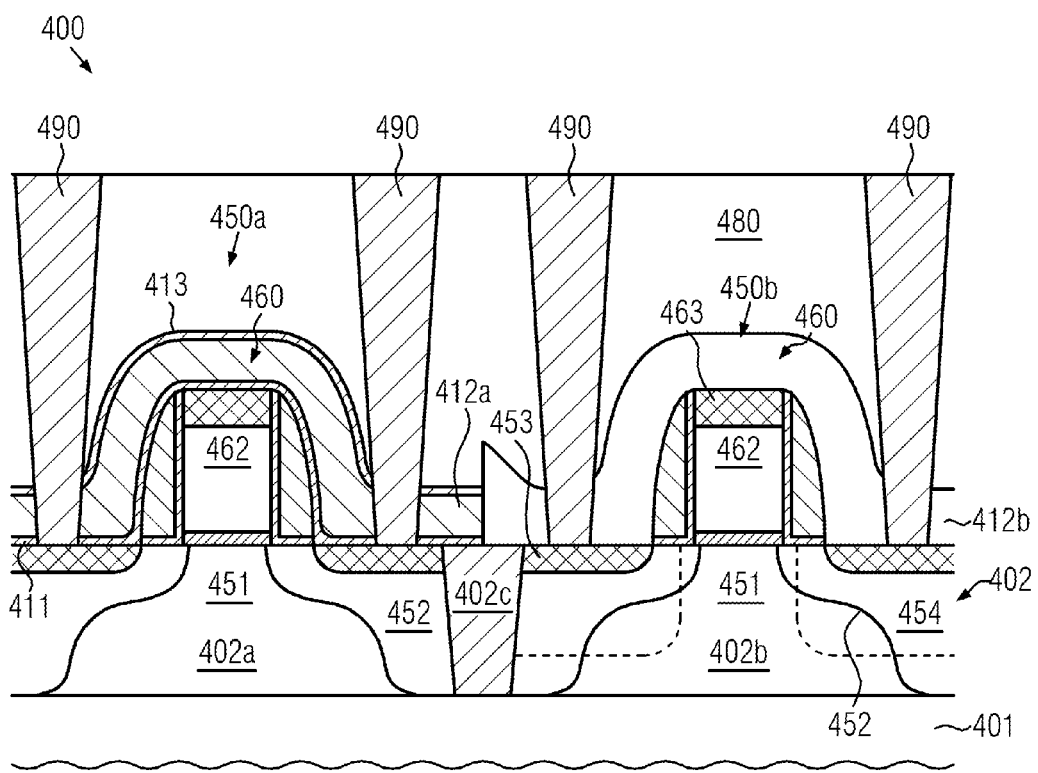

FIG. 4d schematically illustrates the semiconductor device 400 according to a further advanced manufacturing stage in which further processing may be continued by completing the contact level by forming and planarizing an interlayer dielectric layer 480 and forming contacts, e.g., source and drain contacts 490 and/or gate contacts (not shown), as is also discussed above with reference to the semiconductor device 300.

Consequently, upon processing the device 400, a sufficient amount of deuterium may be incorporated into the N-channel and P-channel transistors 450a, 450b on the basis of a dual stress liner approach, wherein an additional deuterium annealing process may be omitted. Hence, reliability and performance of the transistors 450a, 450b may be enhanced due to an increased concentration of deuterium close to the gate dielectric/channel interface of the transistors 450a, 450b and provision of an efficient stress-inducing mechanism. For example, a significant enhancement of performance and of the device stability of N-channel and P-channel transistors 450a, 450b, e.g., with regard to threshold voltage stability, may be observed.

As a result, the present disclosure provides manufacturing techniques in which transistors with deuterium-enhanced gate dielectrics and strained channel regions are formed. The manufacturing processes of strain-inducing dielectric material layers formed above the transistors may be employed to efficiently introduce and diffuse deuterium atoms to the gate dielectrics. The incorporation of deuterium into the strain-inducing dielectric material layers may be accomplished on the basis of a deposition process in which deuterium is present in the process environment during deposition. The process temperature of the deposition process may be chosen to perform—potentially in combination with further subsequently performed process steps—a sufficient diffusion of deuterium to the gate dielectric layer of the transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a substrate comprising a field effect transistor;
performing a deposition process to deposit a first dielectric layer comprising deuterium above said field effect transistor, wherein said deposition process is performed using a combination of precursor gases comprising silane ($SiH_4$), ammonia ($NH_3$), and deuterium gas ($D_2$) so as to incorporate said deuterium into said first dielectric layer during said deposition of said first dielectric layer, said incorporated deuterium having a first deuterium concentration level in said first dielectric layer; and
after depositing said first dielectric layer, adjusting a deuterium concentration in said first dielectric layer so as to adjust an intrinsic strain level of said first dielectric layer, wherein adjusting said deuterium concentration in said first dielectric layer comprises changing said deuterium concentration to a second deuterium concentration level that is different than said first deuterium concentration level.

2. The method of claim 1, further comprising:
forming a second dielectric layer above said first dielectric layer;
forming contact openings in said first and second dielectric layers, wherein said first dielectric layer serves as an etch stop layer; and
forming contacts in said contact openings.

3. The method of claim 1, wherein said deposition process is a chemical vapor deposition process.

4. The method of claim 1, wherein a deposition process temperature during said deposition process is in the range of approximately 450-650° C.

5. The method of claim 1, wherein said first dielectric layer further comprises silicon and nitrogen.

6. The method of claim 1, wherein said first dielectric layer comprises one of intrinsic tensile strain and intrinsic compressive strain.

7. The method of claim 1, wherein said first dielectric layer comprises intrinsic tensile strain and is subjected to a UV-cure process after said deposition.

8. The method of claim 2, further comprising:
forming a second field effect transistor on said substrate, wherein said first dielectric layer is further deposited above said second field effect transistor;
removing said first dielectric layer from said second field effect transistor; and
forming a third dielectric layer above said second field effect transistor, wherein said second dielectric layer is further formed above said second field effect transistor.

9. The method of claim 8, wherein said third dielectric layer comprises one of intrinsic tensile strain and intrinsic compressive strain.

10. A method, comprising:
performing a first deposition process to deposit a first strain-inducing dielectric layer above a first transistor and a second transistor;
selectively removing a portion of said first strain-inducing layer from above said second transistor;
performing a second deposition process to deposit a second strain-inducing dielectric layer above said first transistor and said second transistor, wherein at least one of said first and second deposition processes is performed using a combination of precursor gases that includes deuterium gas ($D_2$) so as to incorporate deuterium into said at least one of said first and second strain-inducing dielectric layers during said respective first or second deposition process; and
selectively removing a portion of said second strain-inducing layer from above said first transistor.

11. The method of claim 10, wherein said first strain-inducing dielectric layer is deposited with said incorporated deuterium during said first deposition process.

12. The method of claim 11, wherein said first strain-inducing dielectric layer comprises intrinsic tensile strain and is subjected to a UV-cure process.

13. The method of claim 11, further comprising removing at least a portion of said incorporated deuterium from said at least one of said first and second strain-inducing dielectric layers so as to adjust an intrinsic strain level of said respective one of said first and second strain-inducing dielectric layers.

14. The method of claim 13, wherein removing at least said portion of said incorporated deuterium from said at least one of said first and second strain-inducing dielectric layers comprises performing a radiation treatment.

15. The method of claim 1, wherein a portion of said incorporated deuterium diffuses to a gate dielectric/channel region interface of said field effect transistor during said deposition of said first dielectric layer.

16. The method of claim 1, wherein a portion of said incorporated deuterium diffuses to a gate dielectric/channel region interface of said field effect transistor during said adjustment of said deuterium concentration in said first dielectric layer.

17. The method of claim 1, wherein adjusting said deuterium concentration in said first dielectric layer comprises performing a radiation treatment.

18. A method, comprising:
depositing a strain-inducing dielectric layer comprising deuterium above a field effect transistor formed in and above a semiconductor layer of a substrate, wherein depositing said strain-inducing dielectric layer comprises performing a deposition process using a combination of precursor gases comprising at least deuterium gas ($D_2$) so as to incorporate said deuterium into said strain-inducing dielectric layer during said deposition process; and
adjusting an intrinsic strain level of said strain-inducing dielectric layer by reducing a concentration of said incorporated deuterium in said strain-inducing dielectric layer.

19. The method of claim 18, wherein said combination of precursor gases further comprises silane ($SiH_4$) and ammonia ($NH_3$).

20. The method of claim 13, wherein removing said at least said portion of said incorporated deuterium from said at least one of said first and second strain-inducing dielectric layers comprises reducing a concentration of deuterium in said at least one of said first and second strain-inducing dielectric layers from a first concentration level to a second concentration level that is less than said first concentration level.

21. The method of claim 1, wherein changing said deuterium concentration in said first dielectric layer to said second deuterium concentration level comprises reducing said deuterium concentration by at least approximately 50%.

22. The method of claim 1, wherein changing said deuterium concentration in said first dielectric layer to said second deuterium concentration level comprises reducing said deuterium concentration by at least approximately 70%.

23. The method of claim 1, wherein adjusting said deuterium concentration in said first dielectric layer comprises removing a portion of said incorporated deuterium from said first dielectric layer so as to reduce said deuterium concentration from said first deuterium concentration level to said second deuterium concentration level, said second deuterium concentration level being less than said first deuterium concentration level.

* * * * *